(12) United States Patent
Do

(10) Patent No.: US 11,829,081 B2
(45) Date of Patent: Nov. 28, 2023

(54) LIFT PIN ASSEMBLY AND APPARATUS FOR TREATING SUBSTRATE WITH THE SAME

(71) Applicant: SEMES CO., LTD., Cheonan-si (KR)

(72) Inventor: Wan Ho Do, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/481,307

(22) Filed: Sep. 22, 2021

(65) Prior Publication Data

US 2022/0091519 A1  Mar. 24, 2022

(30) Foreign Application Priority Data

Sep. 23, 2020  (KR) ........................ 10-2020-0122988

(51) Int. Cl.
  *G03F 7/20* (2006.01)
  *H01L 21/687* (2006.01)
  *G03F 7/00* (2006.01)

(52) U.S. Cl.
  CPC .......... *G03F 7/70808* (2013.01); *G03F 7/707* (2013.01); *H01L 21/68742* (2013.01)

(58) Field of Classification Search
  CPC ...... G03F 7/70808; G03F 7/707; G03F 7/168; G03F 7/70; G03F 7/70691; G03F 7/70708; G03F 7/70716; G03F 7/70733; G03F 7/7075; G03F 7/70758; G03F 7/70791; G03F 7/708; G03F 7/70816; G03F 7/70825; G03F 7/70975; G03F 7/70991; H01L 21/67178; H01L 21/68742; H01L 21/67098; H01L 21/68785; H01L 21/6715–67175; H01L 21/677; H01L 21/67703; H01L 21/67706; H01L 21/67712; H01L 21/67739; H01L 21/67742; H01L 21/67751; H01L 21/683; H01L 21/6831; H01L 21/6833; H01L 21/6835; H01L 21/687; H01L 21/68714; H01L 21/6875; H01L 21/68771; H01L 21/68778; H01L 21/68792; G02F 1/1303
  USPC ...... 355/30, 52–55, 67–77; 269/53–54.5, 67, 269/69–70, 188–195, 207, 211, 210
  See application file for complete search history.

(56) References Cited

U.S. PATENT DOCUMENTS

2008/0134814 A1 * 6/2008 Kim .................. H01L 21/68742
  118/500

FOREIGN PATENT DOCUMENTS

| KR | 20060053779 | * | 5/2006 |
| KR | 1020060066536 | | 6/2006 |
| KR | 1020060078545 | | 7/2006 |
| KR | 100646389 | * | 11/2006 |

(Continued)

OTHER PUBLICATIONS

English translation of KR20060053779, published May 22, 2006. (Year: 2006).*

(Continued)

*Primary Examiner* — Christina A Riddle

(57) ABSTRACT

A lift pin assembly is provided. The lift pin assembly includes a level bolt mounted on a first frame lifted by a lifting device, a lift pin having a weight provided at a lower end of the lift pin, and supported by the level bolt, and a pressing bracket to forcibly move down the lift pin, when the lift pin is locked into a pin hole. The pressing bracket is adjusted in height to be set while maintaining a specific gap to a top surface of the weight.

20 Claims, 12 Drawing Sheets

(56) References Cited

FOREIGN PATENT DOCUMENTS

| KR | 10-2008-0053572 | 6/2008 |
| KR | 10-1468391 | 11/2014 |
| KR | 102121236 | 3/2016 |

OTHER PUBLICATIONS

English translation of KR100646389, published Nov. 23, 2006. (Year: 2006).*

* cited by examiner

LIFT PIN ASSEMBLY AND APPARATUS FOR TREATING SUBSTRATE WITH THE SAME

CROSS-REFERENCE TO RELATED APPLICATIONS

A claim for priority under 35 U.S.C. § 119 is made to Korean Patent Application No. 10-2020-0122988 filed on Sep. 23, 2020, in the Korean Intellectual Property Office, the entire contents of which are hereby incorporated by reference.

BACKGROUND

Embodiments of the inventive concept described herein relate to an apparatus for treating a substrate, and more particularly, relate to a lift pin assembly used to move a flat panel or a substrate up and down from a stage, and an apparatus for treating a substrate with the lift pin assembly.

Recently, as a liquid crystal display (LCD) and a plasma display panel (PDP) have been used to manufacture an image display device, and the substrate of a flat panel display has been used for the LCD and the PDP.

To manufacture the flat panel display, many manufacturing processes are performed while including a process of manufacturing a substrate, a process of manufacturing a cell, and a process of manufacturing a module. In particular, the process of manufacturing the substrate includes a photolithography process to form various patterns on a substrate. The photolithography process is performed by sequentially performing a coating process to coat a photosensitive liquid, such as a photoresist, an exposing process to form a specific pattern on the coated photoresist, and a developing process to develop a region corresponding to the exposed photoresist. Bake processes are performed to perform heat treatment with respect to the substrate after or before performing the coating process and the developing process.

A lifting device is used for a bake unit to move up and move down the substrate from a heat treatment plate. The conventional lifting device includes a lifting frame including a plurality of lift pins fixed to a lower portion of the heat treatment plate. The lifting frame may be configured to move up and down by a driving motor and a ball screw.

When the plurality of lift pins are configured to be simultaneously moved up and down as described above, it is significantly difficult to adjust the heights of the lift pins because lower ends of the lift pins, which are in an upright status, are fixedly coupled to the lifting frame through fastening units such as bolts.

Recently, as a large-size substrate is used, a plurality of lift pins are provided to load/unload the large-size substrate. When any one or more of the lift pins have heights finely different from those of remaining pins, a setting work of equally aligning the heights of the whole pints may be difficult. The setting failure of the lift pints may cause a defect to the substrate when performing process treatment for the substrate.

In addition, the lift pins are fixedly coupled to the lifting frame in the vertical direction through the fastening unit. Accordingly, when the lifting frame is deformed from the level status, the height of each of any one or more lift pints needs to be set.

SUMMARY

Embodiments of the inventive concept provide a lift pin assembly, capable of improving a level work efficiency of lift pints and overcoming the setting failure of the lift pins, and an apparatus for treating a substrate having the same.

Embodiments of the inventive concept provide a lift pin assembly, capable of facilitating the setting of the height of a pressing bracket to forcibly move down a lift pin, when the lift pin is locked to a pin hole, and an apparatus for treating a substrate having the same.

The objects which will be achieved in the inventive concept are not limited to the above, but other objects, which are not mentioned, will be apparently understood to those skilled in the art.

According to an embodiment, there may be provided a lift pin assembly including a level bolt mounted on a first frame lifted by a lifting device, a lift pin having a weight provided at a lower end of the lift pin, and supported by the level bolt, and a pressing bracket to forcibly move down the lift pin, when the lift pin is locked into the pin hole. The pressing bracket is adjusted in height to be set while maintaining a specific gap to a top surface of the weight.

In addition, the pressing bracket may be provided to be adjusted in height simultaneously when a level of the level bolt is adjusted.

In addition, the pressing bracket may include a pressing part having one end fixed to the level bolt and positioned while maintaining the specific gap from the top surface of the top surface of the weight.

In addition, the pressing bracket may further include a vertical part vertically extending downward from one side of the pressing part, and a fixing part extending horizontally from a lower end of the vertical part and fixed by a lower tab of the level bolt.

In addition, the pressing bracket may include a pressing part positioned while maintaining the specific gap from the top surface of the weight, and a fixing part extending vertically from one end of the pressing part and fixed to a side surface of the first frame.

In addition, the fixing part may include a slit hole vertically extending such that a fixing bolt is fixed to the side surface of the first frame.

In addition, the pressing part may include a through hole having a diameter smaller than a diameter of the weight and greater than a diameter of the lift pin. The through hole may be provided to be open in one side.

In addition, the lift pin assembly further includes a bolt plate fixedly and horizontally coupled to a bottom surface of the first frame. The level bolt may be mounted on the bolt plate perpendicularly to the bolt plate.

In addition, the level bolt may include a bolt head positioned on the top surface of the bolt plate and a lower tab positioned on a bottom surface of the bolt plate.

In addition, the fixing part of the pressing bracket may be fixed to the lower tab of the level bolt adjusted in height on the bolt plate.

According to an embodiment, there may be provided an apparatus for treating a substrate, which includes a housing having a treatment space for performing a process for the substrate, a substrate support plate provided in the treatment space and having a top surface, which is to place the substrate and pin holes, and a lift pin assembly to load/unload the substrate onto/from the substrate support plate. The lift pin assembly includes a lifting device, a first frame moved up and down by the lifting device, level bolts mounted on the first frame, lift pins having weights provided at lower ends of the lift pins, supported by the level bolts, respectively, and moved up when the first frame is moved up, and moved down by self-weight when the first frame is moved down, and a pressing bracket to forcibly move down the lift pin when the first frame is moved down and when the lift pin is locked into the pin hole. The pressing bracket is adjustable in height to be set while maintaining a specific gap from a top surface of the weight.

In addition, the pressing bracket may include a fixing part fixed to a lower end of the level bolt, a vertical part vertically extending upward from the fixing part, and a pressing part horizontally extending from the vertical part and positioned on the top surface of the weight, and provided to maintain the specific gap from the top surface of the weight. The pressing bracket may be adjusted in height simultaneously when a level of the level bolt is adjusted.

In addition, the apparatus may further include a bolt plate fixedly and horizontally coupled to a bottom surface of the first frame. The level bolt may be mounted on the bolt plate perpendicularly to the bolt plate.

In addition, the level bolt may include a bolt head positioned on the top surface of the bolt plate to support the weight of the lift pin when the first frame is moved up and a lower tab positioned on a bottom surface of the bolt plate. The fixing part of the pressing bracket is fixed to the lower tab.

In addition, the pressing bracket may include a pressing part positioned while maintaining the specific gap from the top surface of the weight, and a fixing part extending vertically from one end of the pressing part and fixed to a side surface of the first frame.

In addition, the fixing part may include a slit hole vertically extending such that a fixing bolt is fixed to the side surface of the first frame and a fixing height of the pressing bracket is adjusted.

In addition, the pressing part may include a through hole having a diameter smaller than a diameter of the weight and greater than a diameter of the lift pin. The through hole may be provided to be open in one side.

In addition, the lifting device may include a base frame provided under the first frame, lifting units spaced apart from a center of the base frame by a specific distance, and provided on the base frame to be elevatable, a driving unit to drive such that the lifting units are simultaneously moved up and moved down, and a power transmitting unit to simultaneously transmit driving force of the driving unit to the lifting units.

According to an embodiment, there may be provided a lift pin assembly includes a first frame moved up and down by a lifting device, level bolts mounted on the first frame, lift pins having weights provided at lower ends of the lift pins, supported by the level bolts, respectively, and moved up when the first frame is moved up, and moved down by self-weight when the first frame is moved down, and a pressing bracket to forcibly move down the lift pin when the first frame is moved down and when the lift pin is locked into the pin hole. The pressing bracket may include a fixing part fixed to a lower end of the level bolt, a vertical part vertically extending upward from the fixing part, and a pressing part horizontally extending from the vertical part and positioned on the top surface of the weight, and provided to maintain the specific gap from the top surface of the weight. The pressing bracket may be provided to be adjusted in height simultaneously when a level of the level bolt is adjusted.

In addition, the lift pin assembly may further include bolt plates fixedly and horizontally fixed to a bottom surface of the first frame. The level bolts are perpendicularly mounted on the bolt plates. The level bolt may include a bolt head positioned on the top surface of the bolt plate to support the weight of the lift pin when the first frame is moved up and a lower tab positioned on the bottom surface of the bolt plat. The fixing part of the pressing bracket is fixed to the lower tab.

In addition, the pressing part may include a through hole having a diameter smaller than a diameter of the weight and greater than a diameter of the lift pin. The through hole may be provided to be open in one side.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
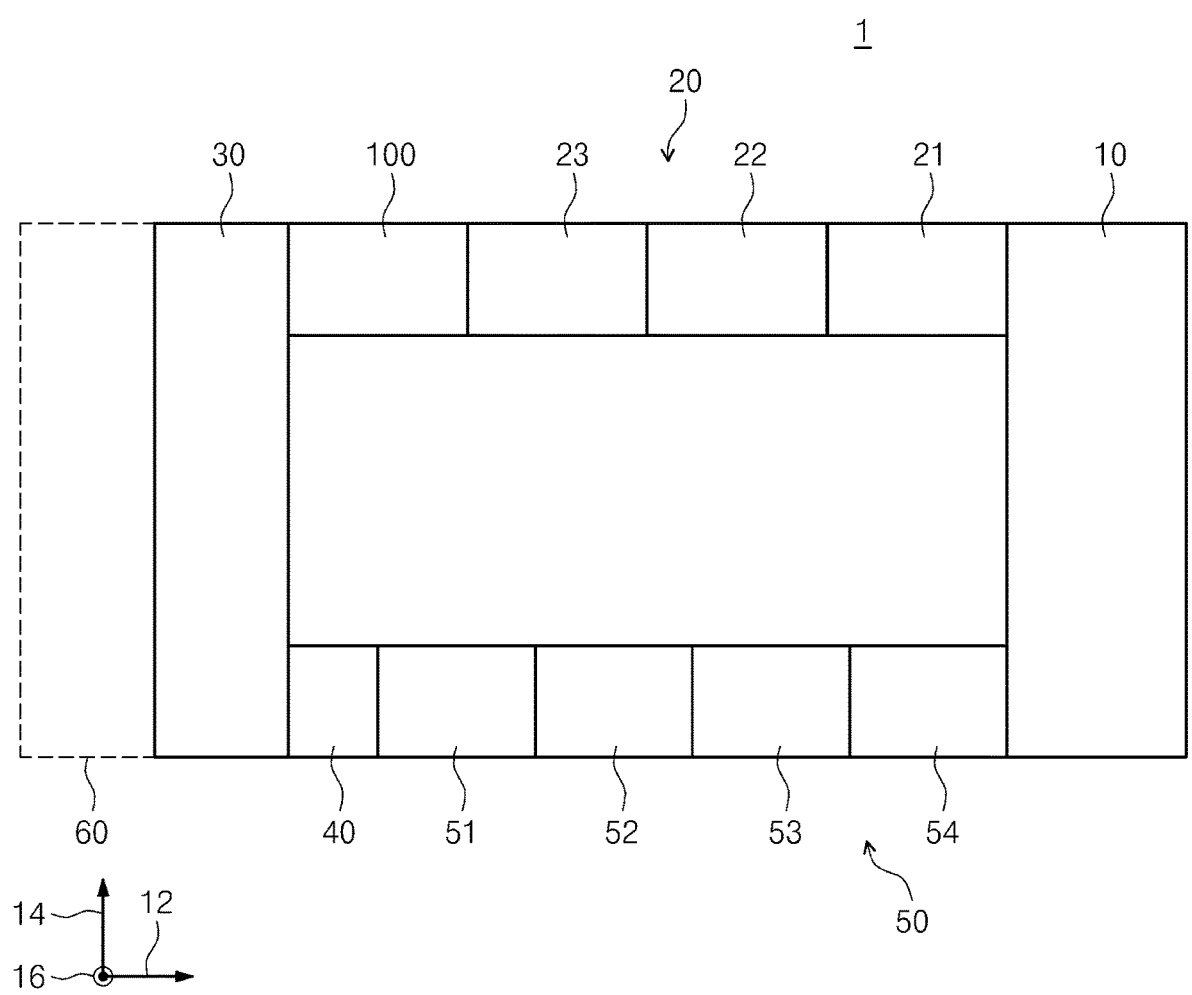
FIG. 1 is a view illustrating equipment for a photolithography process, according to the inventive concept.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

In the following description according to an embodiment of the inventive concept, a bake device used in photolithography equipment will be described by way of example.

According to the present embodiment, a substrate is used to manufacture a flat panel display (FPD). The FPD may include a liquid crystal display (LCD), a plasma display (PDP), a vacuum fluorescent display (VFD), a field emission (FED) device, or an electro luminescence display (ELD).

An apparatus for treating a substrate according to the inventive concept is a bake device used to heat and cool the substrate in a photolithography process.

As illustrated in FIG. 1, equipment 1 for the photolithography process may include an index module 10, a coating module 20, an interface module 30, an edge exposure device 40, a liquid treating module 50, and an exposure module 60.

A substrate "W" is introduced into or withdrawn out of the index module 10. The index module 10 has a length disposed in a second direction 14. In this case, the second direction 14 is a direction that the index module 10 extends. A direction perpendicular to the second direction 14 is referred to as a first direction 12, when viewed from above. A direction perpendicular to both the first direction 12 and the second direction 14 is referred to as a third direction 16.

For example, the index module 10 may introduce or withdraw the substrate "W" through a carrying roller or a transfer robot to carry the substrate "W".

The coating module 20 performs a coating process with respect to the substrate "W". The coating module 20 is provided adjacent to one side of the index module 10. The coating module 20 has a length extending in the first direction 12. The coating module 20 may include a cleaning unit 21, a coating unit 22, a vacuum drying unit 23, and a bake unit 100. A cleaning process, a coating process, a vacuum drying process (VCD), and a baking process may be sequentially performed in the coating module 20. The cleaning unit 21 cleans the substrate "W" before performing the coating process for the substrate "W". The cleaning unit 21 may perform the cleaning process by supplying a cleaning liquid to the substrate "W". For example, the cleaning unit 21 may supply the cleaning liquid through a cleaning liquid supplying unit provided on the substrate "W". For example, the cleaning liquid may be supplied in the form of pure water.

The coating unit 22 performs the coating process with respect to the substrate "W". The substrate "W", which has experienced the coating process, is transferred to the vacuum drying unit 23. The vacuum drying unit 23 removes an organic solvent contained in a photoresist (PR) while performing the drying process.

The bake unit 100 performs the baking process with respect to the substrate "W". For example, the baking process may heat the substrate "W" through a heating unit mounted under the substrate "W".

The substrate "W", which has completely experienced the processes in the coating module 20, is transferred to the interface module 30. The interface module 30 carries the substrate "W" from the coating module 20 to the liquid treating module 50 and the exposure module 60. The interface module 30 is disposed adjacent to the coating module 20 and the liquid treating module 50. The interface module 30 is disposed in parallel to the index module 10. The interface module 30 has a length extending in the second direction 14. When the substrate "W" is carried from the interface module 30, the substrate "W" may be carried by using the transfer robot.

The edge exposure device 40 performs an edge exposing process with respect to the substrate "W" to irradiate light to an edge region of the substrate "W". The edge exposure device 40 is interposed between the interface module 30 and the liquid treating module 50. Alternatively, the edge exposure device 40 may be interposed between the coating module 20 and the interface module 30.

An exposing process is performed with respect to the substrate "W" in the exposure module 60. The exposure module 60 is disposed adjacent to one side of the interface module 30.

The liquid treating module 50 may serve as a developing module to perform a developing process with respect to the substrate "W". The index module 10 is disposed adjacent to one side of the liquid treating module 50. The liquid treating module 50 is disposed to be parallel to the coating module 20, with the length extending in the first direction 12.

The liquid treating module 50 includes a liquid treating unit 51, a rinsing unit 52, a drying unit 53, and an inspector 54. In the liquid treating module 50, after a liquid treating process is performed in the liquid treating unit 51, a rinsing process and a drying process are performed in the rinsing unit 52 and the drying unit 53, respectively, and the substrate "W" is inspected in the inspector 54. For example, the liquid treating process may be the developing process.

Figure 2:
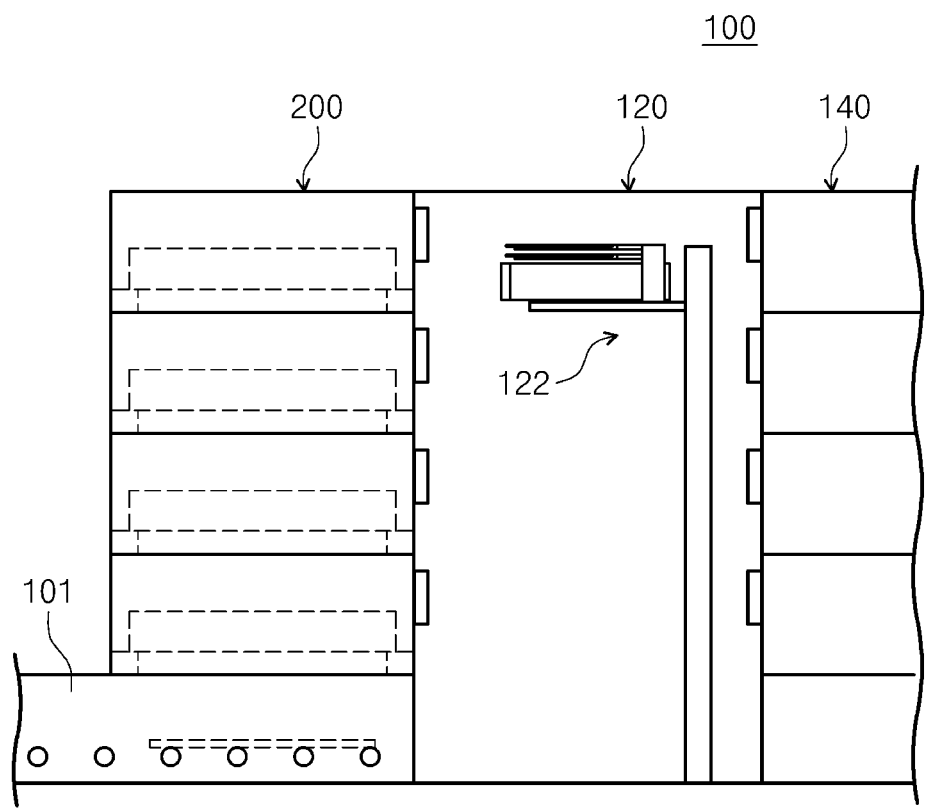
FIG. 2 is a view schematically illustrating the configuration of a bake unit.

FIG. 2 is a view schematically illustrating the configuration of a bake unit.

Referring to FIG. 2, the bake unit 100 may include a bake chamber 200 and a carrying chamber 120.

A transfer robot 122 may be provided in the carrying chamber 120 to carry the substrate "W". The transfer robot 122 transfers the substrate "W", which is carried through a conveyor carrying route 101, into the bake chamber 200, or transfers the substrate "W", which has experienced heat treatment in the bake chamber 200, to a cooling chamber 140.

A plurality of bake chambers 200 may be stacked in a vertical direction. Each bake chamber 200 may include a shutter to open or close an opening to introduce or withdraw the substrate "W" into or out of the bake chamber 200. The bake chamber 200 is an apparatus for treating a substrate, which performs heat treatment with respect to the substrate "W". The apparatus for treating the substrate will be described below with reference to FIG. 3.

Figure 3:
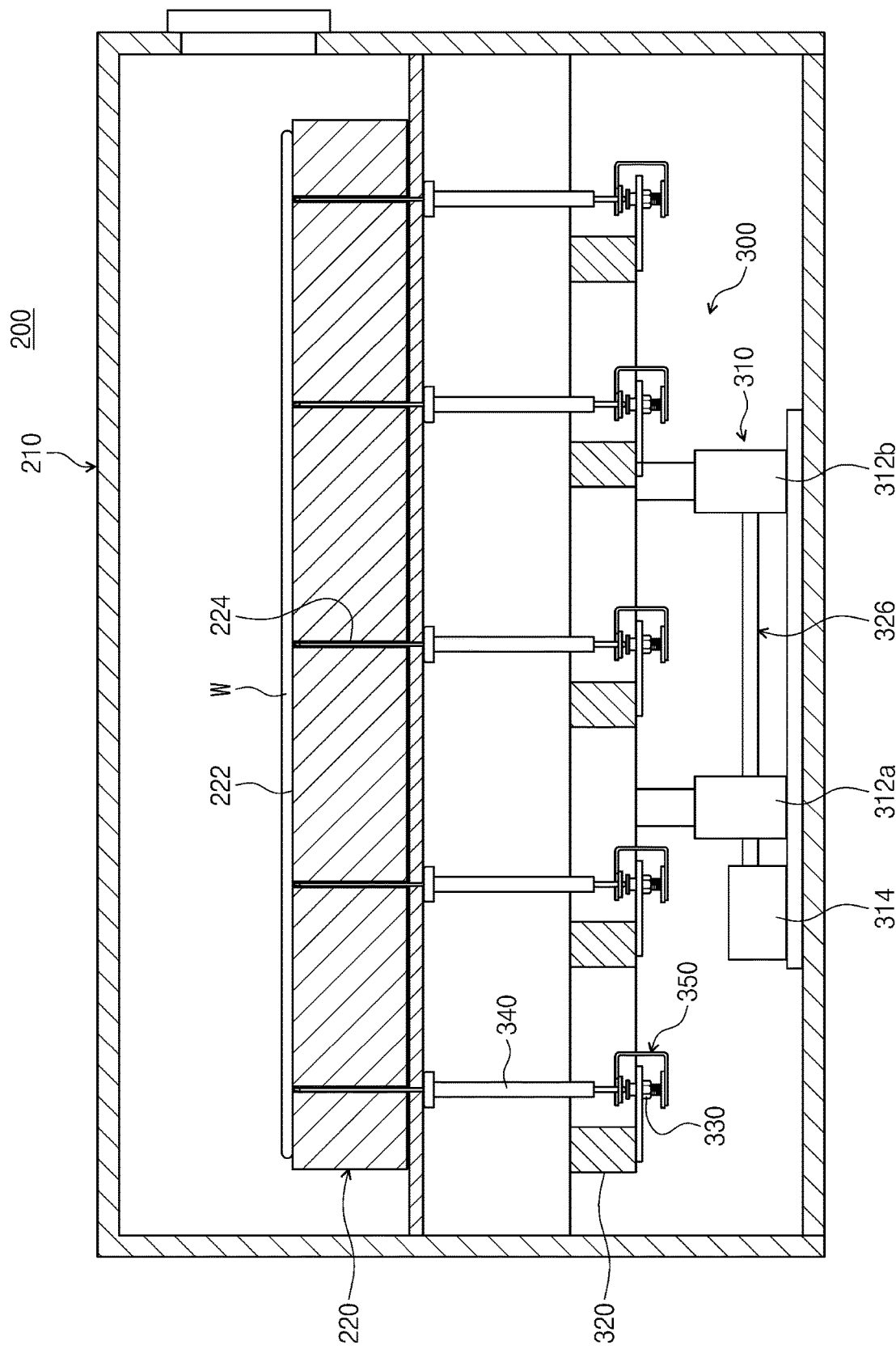
FIG. 3 is a view illustrating a bake chamber illustrated in FIG. 2.
Figure 4:
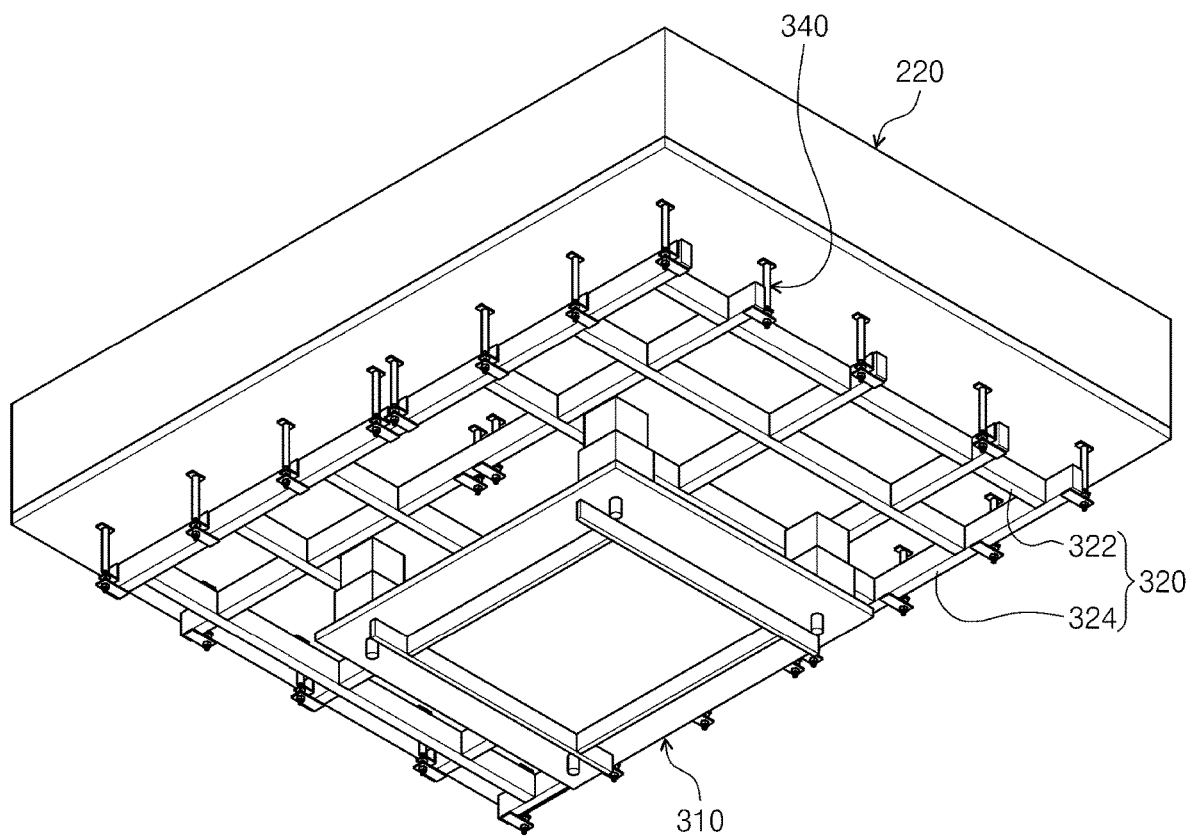
FIG. 4 is a view illustrating a lift pin assembly.

FIG. 3 is a view illustrating a bake chamber illustrated in FIG. 2, and FIG. 4 is a view illustrating a lift pin assembly.

Referring to FIGS. 3 and 4, the bake chamber 200 may include a housing 210, a substrate support plate 220, and a lift pin assembly 300.

The housing 210 provides a treatment space in which a bake process is performed with respect to the substrate "W". The substrate support plate 220 is positioned inside the housing 210, and includes a top surface 222 and a pin hole 224 to place the substrate "W".

The lift pin assembly 300 loads/unloads the substrate "W" onto/from the substrate support plate 220. For example, the lift pin assembly 300 may include a lifting device 310, a first frame 320, level bolts 330, lift pins 340, and pressing brackets 350.

The first frame 320 includes horizontal support bars 322 spaced apart from each other and provided in parallel to each other, and vertical support bars 324 connected with the horizontal support bars 322 while crossing the horizontal support bars 322.

The lifting device 310 may be mounted on a base frame 302 provided below the first frame 320. The lifting device 310 may include a plurality of lifting units 312, a driving unit 314, and a power transmitting unit 326.

Figure 11:
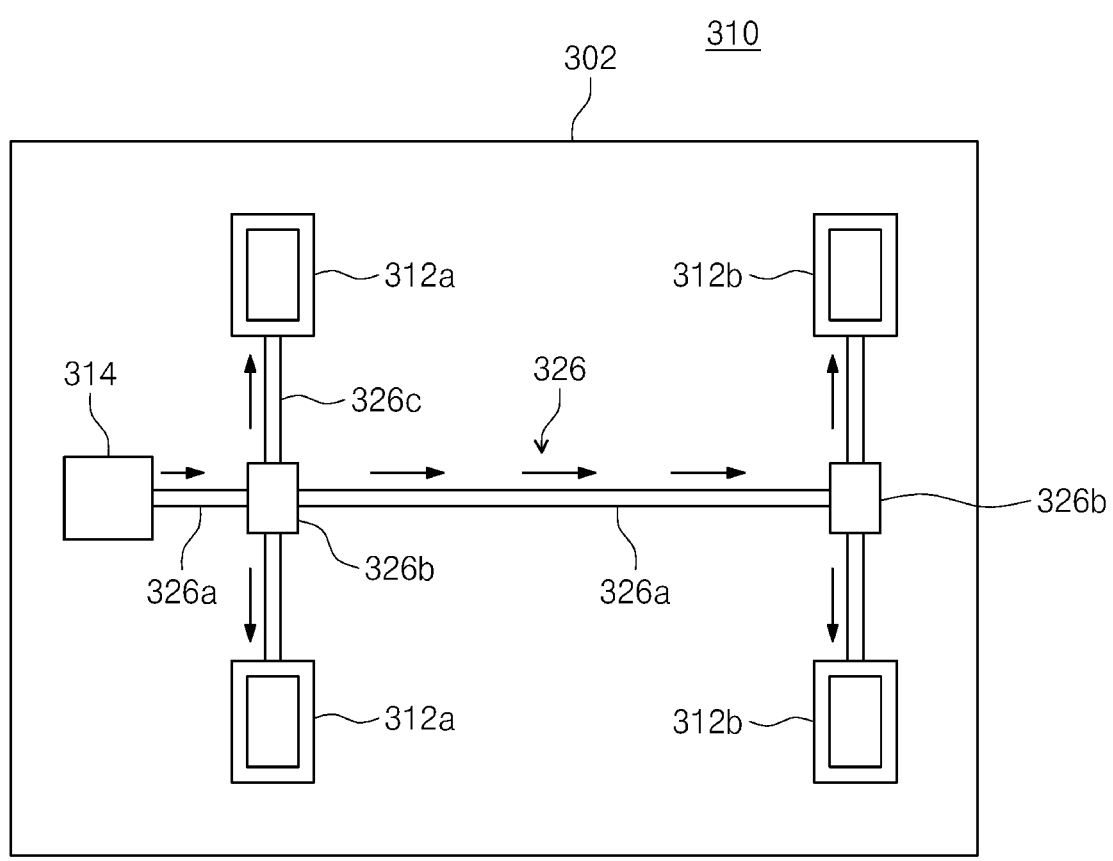
FIG. 11 is a view illustrating a lifting device.

FIG. 11 is a view illustrating a lifting device.

Referring to FIGS. 3 and 11, the plurality of lifting units 312 may include a pair of first lifting units 312a and a pair of second lifting units 312b. The pair of first lifting units 312a and the pair of second lifting units 312b are spaced apart from the center of the base frame 302 by a specific distance, and may be provided to be elevatable on the base frame 302. The pair of first lifting units 312a and the pair of second lifting units 312b are connected with the first frame 320 in one ends thereof to move up and move down the first frame 320.

The driving unit 314 provides driving force such that the pair of first driving units 312a and the pair of second lifting units 312b are simultaneously moved up and down. The driving force of the driving unit 314 may be transmitted to the pair of first lifting units 312a and the pair of second lifting units 312b through the power transmitting unit 326. For example, the driving unit 314 may be a motor. The power transmitting unit 326 may include a driving shaft 326a, gear boxes 326b, and rotating shafts 326c connected with the lifting units 312. As described above, the pair of first lifting units 312a and the pair of second lifting units 312b are mechanically connected with each other to simultaneously operate. Accordingly, an additional control device to control synchronization is not required.

As described above, the lifting device 310 has a feature that the pair of first lifting units 312a and the pair of second lifting units 312b simultaneously move up and down through the driving of the one driving unit 314.

Figure 5:
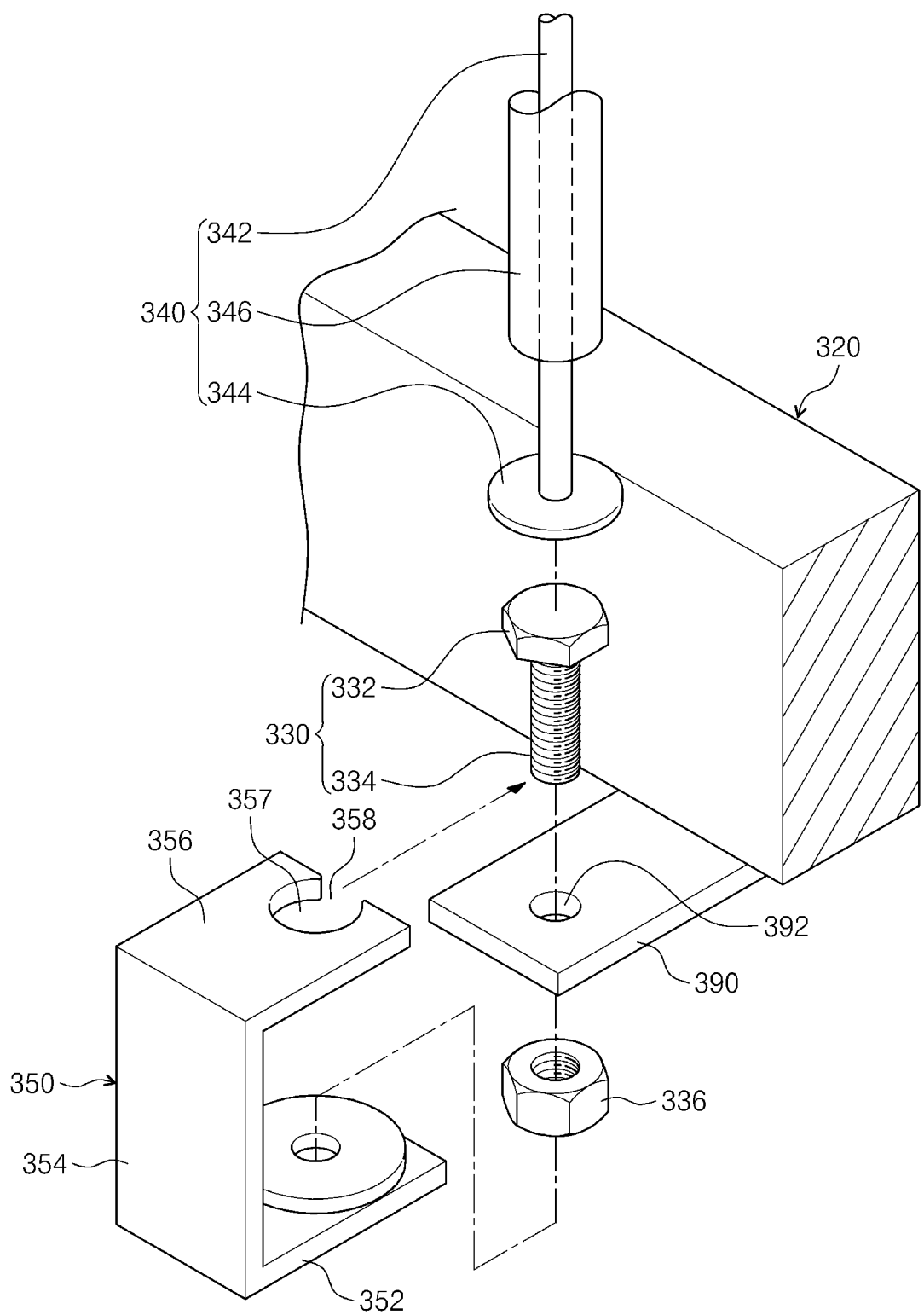
FIGS. 5 and 6 are an exploded perspective view of a subject matter of a lift pin assembly.
Figure 6:
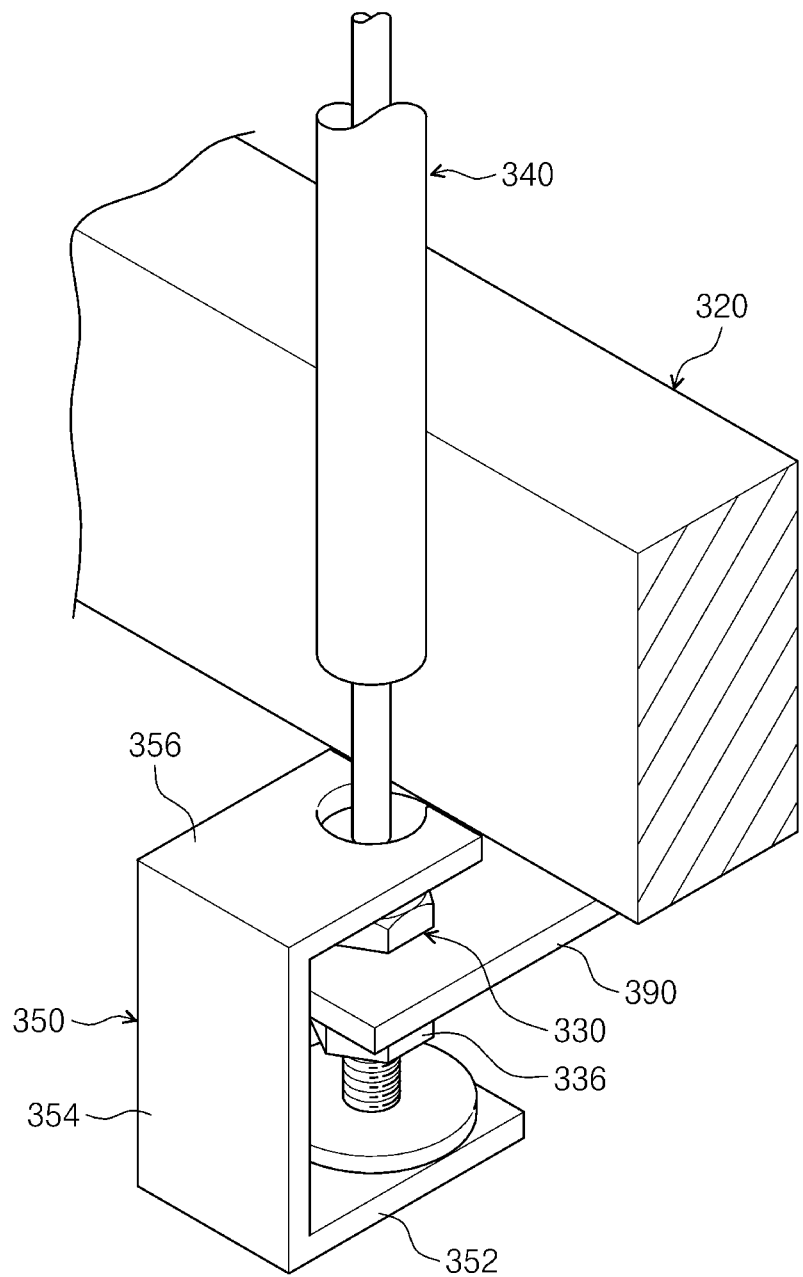

FIGS. 5 and 6 are an exploded perspective view of a subject matter of a lift pin assembly.

Referring to FIGS. 5 and 6, the level bolt 330 may be fixedly mounted on the first frame 320. The central axis of the level bolt 330 is aligned line with each pin hole 224 of the substrate support plate 220.

The level bolt 330 may be vertically mounted in a through hole 392 of a bolt plate 390. The bolt plate 390 is horizontally fixedly coupled to the bottom surface of the first frame 320. The level bolt 330 may include a bolt head 332, a lower tab 334, and a fixing nut 336. The bolt head 332 is positioned on a top surface of the bolt plate 390, and the lower tab 334 is positioned on the bottom surface of the bolt plate 390 after passing through the through hole 392 of the bolt plate 390. The level bolt 330 may vertically adjust the height on the bolt plate 390 to adjust the level of the lift pin 340.

The lift pin 340 may include a pin 342 and a weight 344. The weight 344 may be provided at a lower end of the pin 342. The lift pin 340 is positioned in the pin hole 224 through a guide bush 346 fixed to a bottom surface of the substrate support plate 220. The guide bush 346 guides the pin 342 of the lift pin 340 that moves up and down.

Figure 7A:
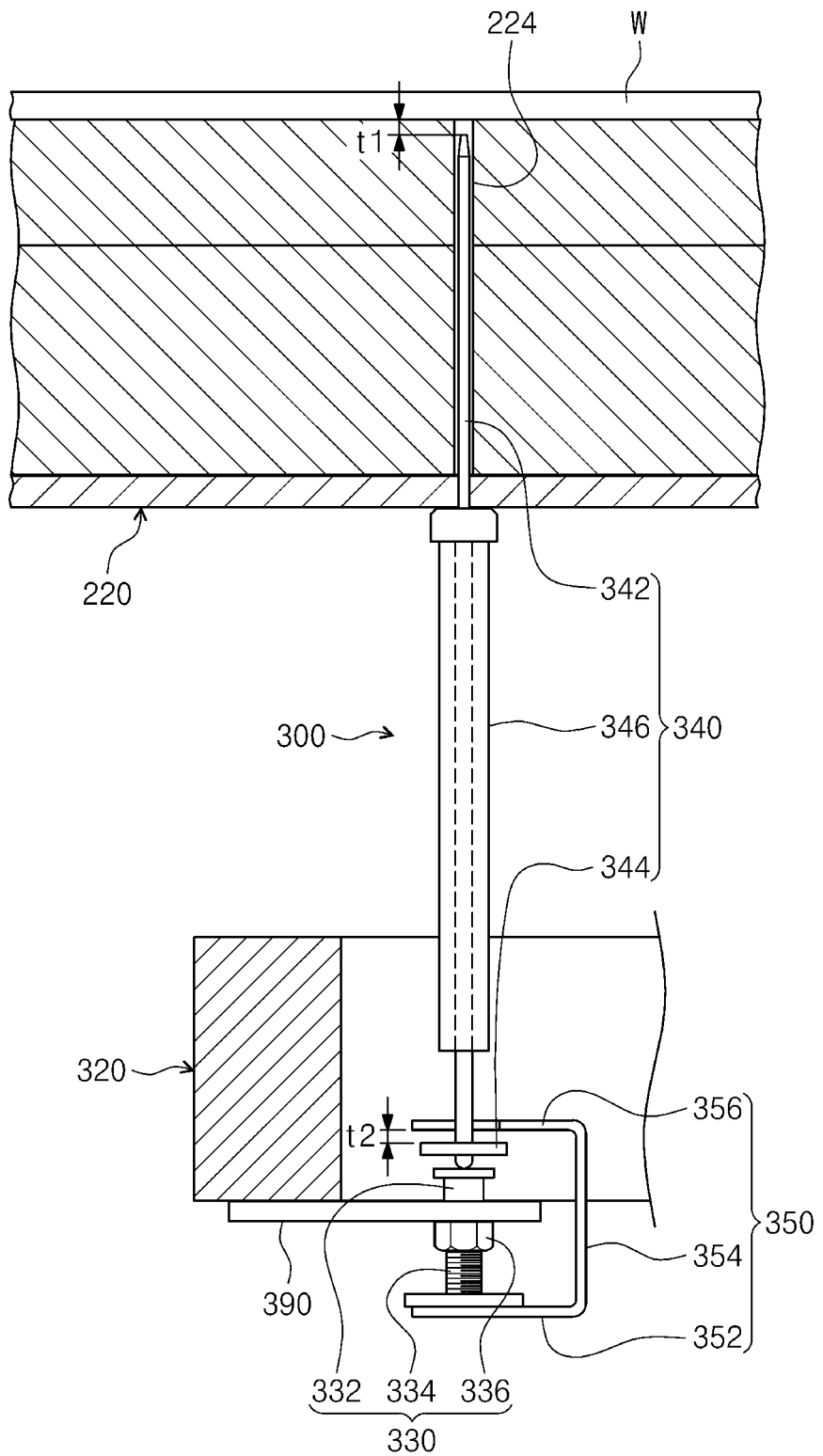
FIGS. 7A and 7B are views illustrating an up status and a down status of a lift pin.
Figure 7B:
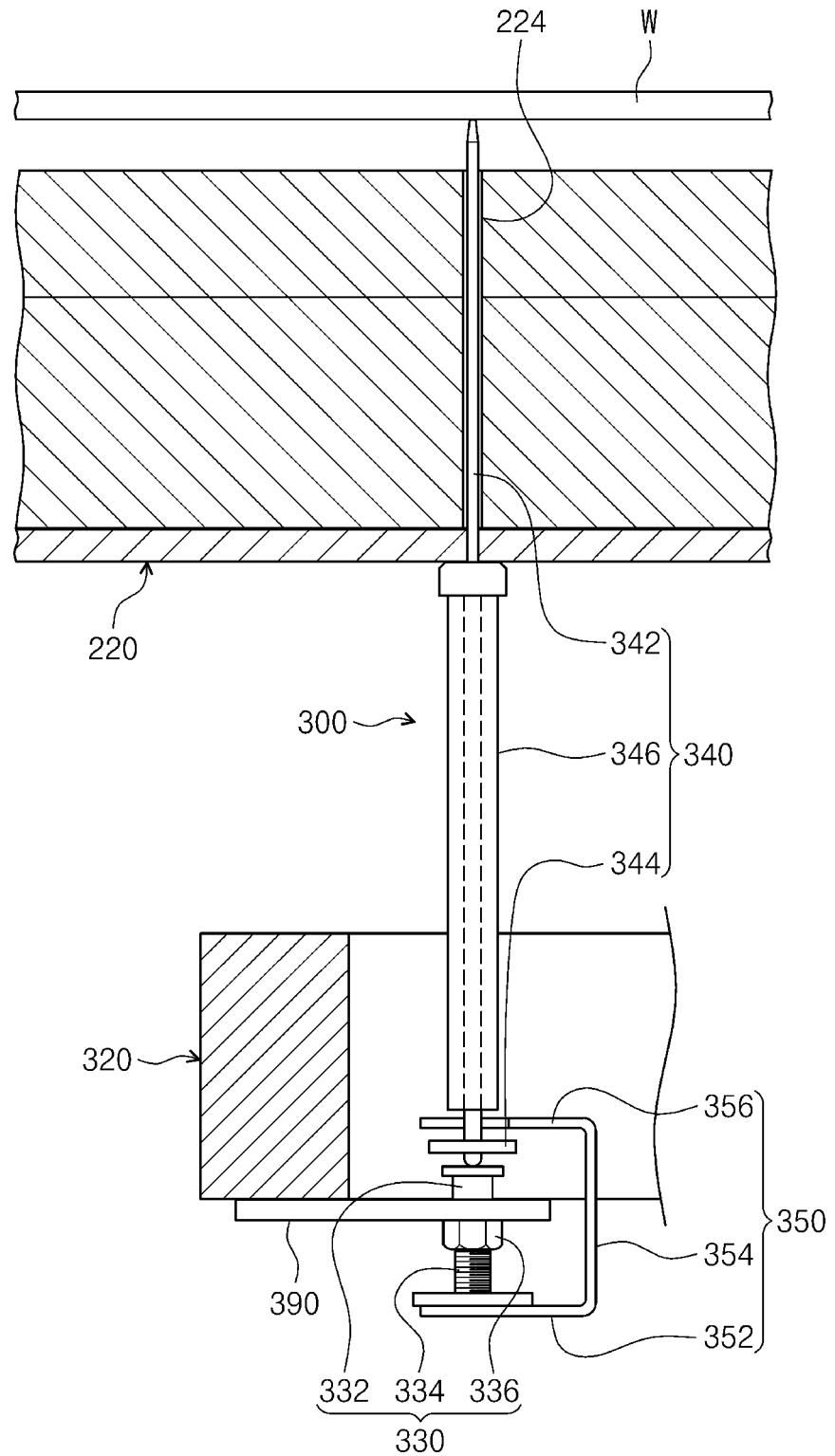

FIGS. 7A and 7B are views illustrating an up status and a down status of a lift pin.

Referring to FIGS. 5 to 7B, when the first frame 320 is moved up, the lift pin 340 is supported by the level bolt 330 and moved up. In addition, when the first frame 320 is moved down, the lift pin 340 is moved down by self-weight. Regarding a down position of the lift pin 340 when the lift pin 340 is moved down, the upper end of the lift pin 340 is preferably positioned under a specific distance "t1" (for example, 2 mm) from a top surface of the substrate support plate 220. Regarding an up position of the lift pin 340 when the lift pin 340 is moved up, the up position may be at the height allowing the carrying device of the substrate "W" to load or unload the substrate onto/from the top surface 222 of the substrate support plate 220, as the substrate "W" is spaced apart from the top surface 222 of the substrate support plate 220.

The pressing bracket 350 is provided to forcibly move down the lift pin 340, when the first frame 320 is moved down and when the lift pin 340 is locked into the pin hole 224. The pressing bracket 350 is preferably set to be maintained by a specific gap from the top surface of the weight 344. The pressing bracket 350 is provided such that the height of the pressing bracket 350 is adjusted when the equipment is set. For example, the height of the pressing bracket 350 may be simultaneously adjusted when the level of the level bolt 330 is adjusted.

For example, the pressing bracket 350 may include a fixing part 352, a vertical part 354, and a pressing part 356. The pressing bracket 350 has the substantially C-shape section. The fixing part 352 is fixed to a lower end of the level bolt 330. The vertical part 354 extends vertically upward from the fixing part 352. The pressing part 356 extends horizontally from the vertical part 354 and is positioned on a top surface of the weight 344. The pressing part 356 is provided to maintain a specific gap "t2" (for example, 1.5 mm) from the top surface of the weight 344. The pressing part 356 has a through hole 357. The through hole 357 is formed to have a diameter smaller than that of the weight 344 and greater than that of the lift pin 340. The through hole 357 has an opening 358 that is open in one side of the through hole 357.

In this case, the gap between the pressing part 356 and the weight 344 is necessary because the interference is avoided in introducing the substrate "W" only when a pin standby position (the down position) is positioned under the distance of at least 0.5 mm from the top surface 222 of the substrate support plate 220.

As described above, the pressing bracket 350 has the same reference plane (the bottom surface of the first frame) as that of the level bolt 330.

Hereinafter, the mounting of the pressing bracket 350 will be described. First, the bolt head 332 of the level bolt 330 is fastened till the top surface of the bolt plate 390, while the bottom surface of the first frame 320 is employed as a reference plane for fastening. If then, since the bolt head 332 of the level bolt 330 is always uniform, the heights of the lift pins 340 supported on the top surfaces of the bolt heads 332 are equally set.

Figure 8:
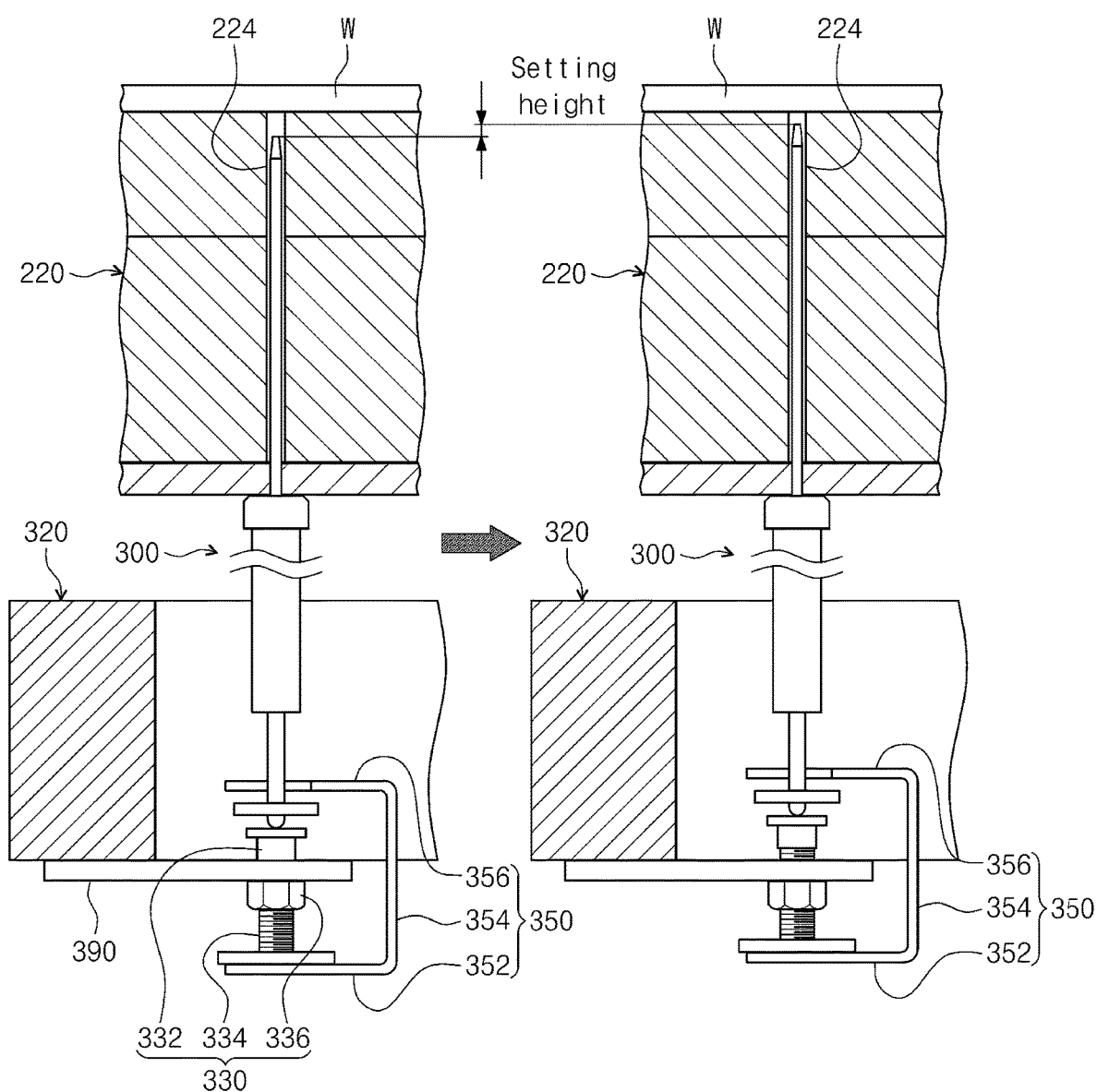
FIG. 8 is a view illustrating adjusting the height of a level bolt.

For reference, when the level status of the first frame 320 is deformed, the height of the lift pin 340 may be changed depending on the position of the first frame 320. In this case, as illustrated in FIG. 8, the setting height of the lift pin 340 may be adjusted by changing the height of the level bolt 330 from the bolt plate 390. As described above, when the settings of the level bolt 330 and the lift pin 340 are finished, and when the fixing part 352 of the pressing bracket 350 is fixed by using the lower tab of the level bolt 330, the level bolt 330, the lift pin 340, and the pressing bracket 350 are stacked based on the same plane, and the gap between the pressing part 356 and the weight 344 is always automatically set. As described above, since the level bolt 330 and the pressing bracket 350 have the same assembling reference position, the lift pin 240 may be set on the first frame 320 without an additional work or an additional jig.

As described above, in the lift pin assembly 300 when only the height of the level bolt 330 is adjusted, even the height of the pressing bracket 350 is adjusted. Accordingly, the distance between the pressing part 356 and the weight 344 may be maintained by a constant gap FIGS. 9 and 10 are views illustrating a pressing bracket, according to another embodiment of the inventive concept.

Figure 9:
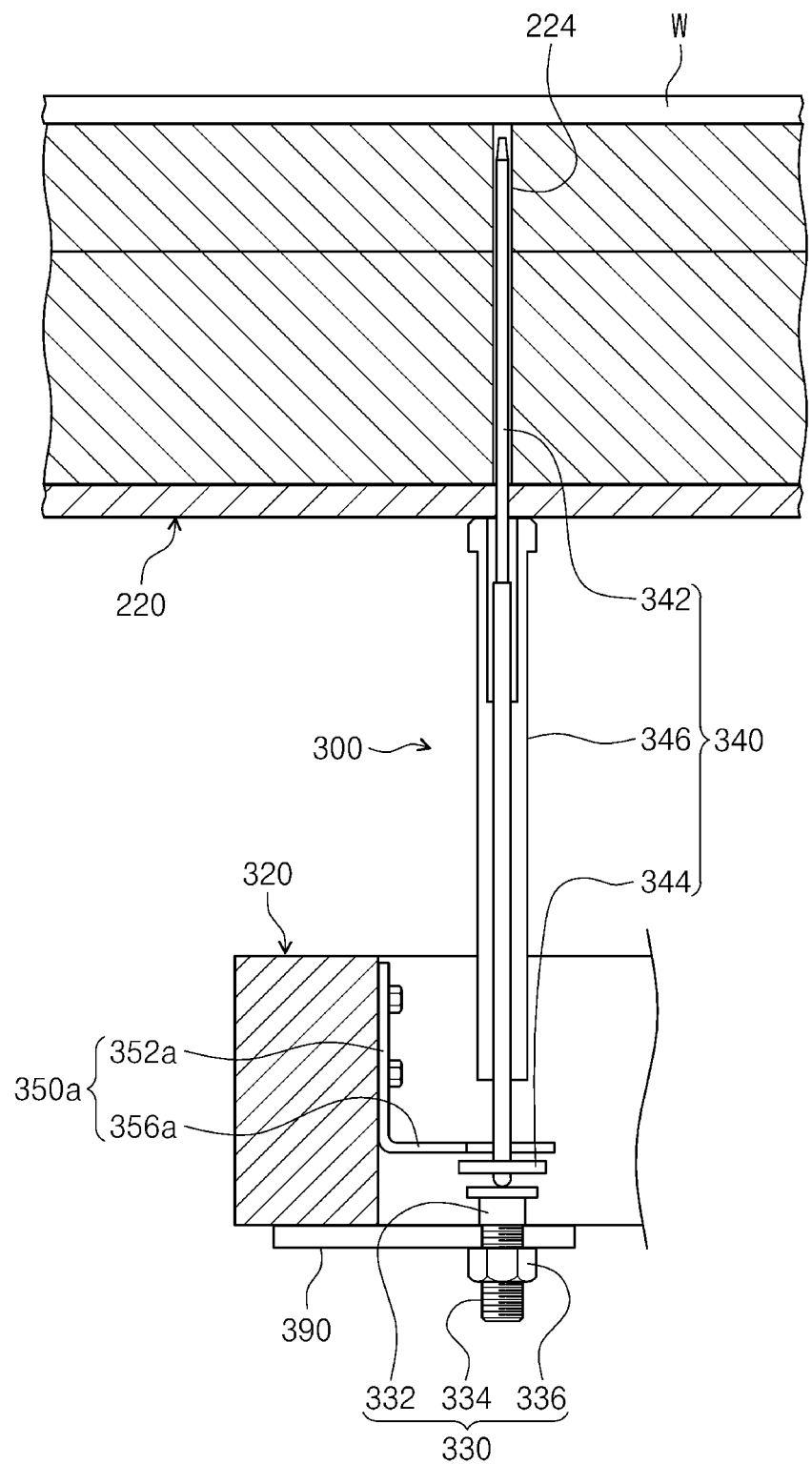
FIGS. 9 and 10 are views illustrating a pressing bracket, according to another embodiment of the inventive concept.
Figure 10:
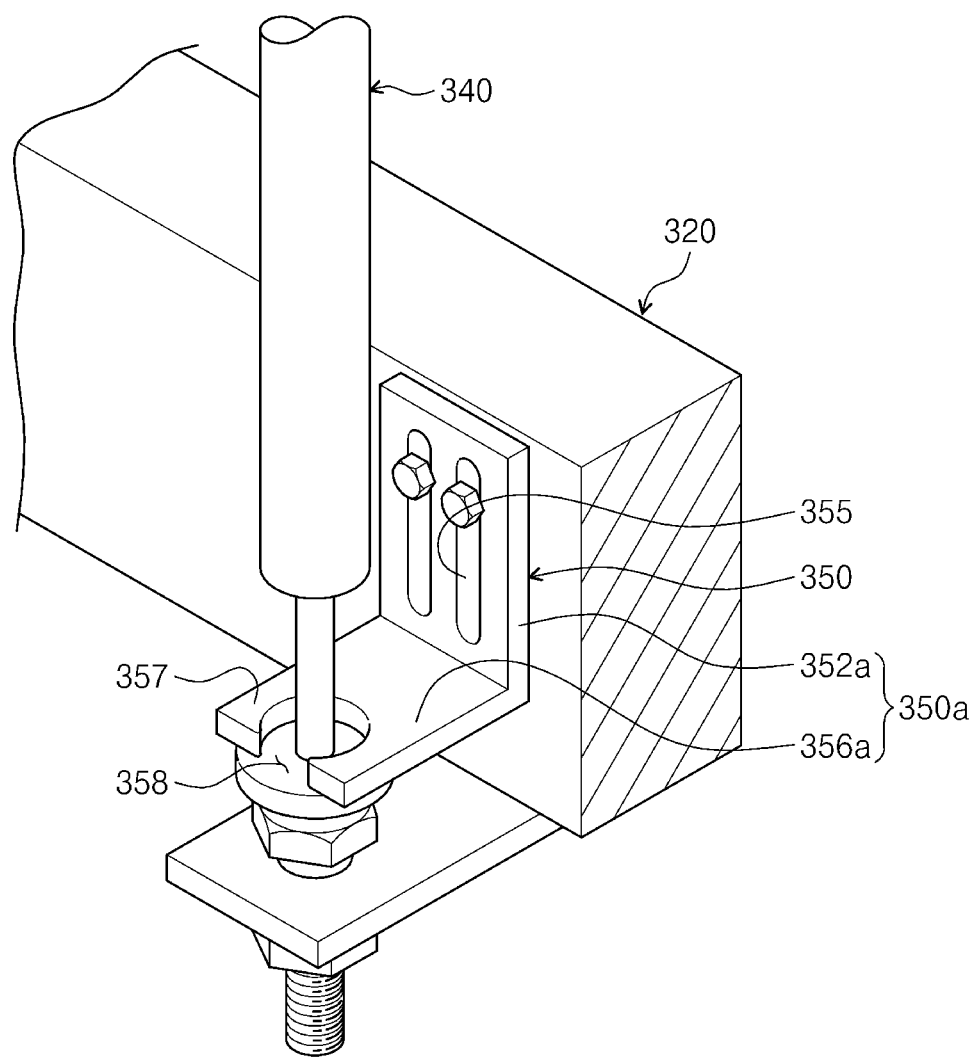

As illustrated in FIGS. 9 and 10, a pressing bracket 350a includes a pressing part 356a maintained at a uniform distance from a top surface of the weight 332, and a fixing part 352a extending in a vertical direction from one end of the pressing part 356a and fixed to a side surface of the first frame 320. The fixing part 352a includes a slit hole 355 formed in the vertical direction, such that the fixing part 352a is fixed to the side surface of the first frame 320 by a fastening bolt and the height of the fixing part 352a is adjusted.

The pressing bracket 350a having the above-described configuration may be adjusted in height, independently from the level bolt 330.

According to the embodiments of the inventive concept, a lift pin assembly can improve a level work efficiency of lift pins and overcome the setting failure of the life pins.

According to an embodiment of the inventive concept, a lift pin assembly can facilitate the setting of the height of a pressing bracket to forcibly move down a lift pin when the lift pin is locked to a pin hole.

The technical effects to be solved by the inventive concept are not limited to the aforementioned effects, and any other technical effects not mentioned herein will be clearly understood from the following description by those skilled in the art to which the inventive concept pertains.

Hereinabove, although the inventive concept has been described with reference to embodiments and the accompanying drawings, the inventive concept is not limited thereto, but may be variously modified and altered by those skilled in the art to which the inventive concept pertains without departing from the spirit and scope of the inventive concept claimed in the following claims. Therefore, the embodiments of the inventive concept are provided to explain the spirit and scope of the inventive concept, but not to limit them, so that the spirit and scope of the inventive concept is not limited by the embodiments. The scope of the inventive concept should be construed on the basis of the accompanying claims, and all the technical ideas within the scope equivalent to the claims should be included in the scope of the inventive concept.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A lift pin assembly configured to load/unload a substrate onto/from a substrate support plate, and comprising:
    a level bolt mounted on a first frame lifted by a lifting device;
    a lift pin having a weight provided at a lower end of the lift pin, and supported by the level bolt, wherein the weight is directly connected to the lower end of the lift pin; and
    a pressing bracket configured to forcibly move down the lift pin, when the lift pin is locked into a pin hole that is formed in the substrate support plate
    wherein the pressing bracket is adjustable in height to be set, and
    wherein when the pressing bracket is adjusted in height, a portion of the pressing bracket is positioned over a top surface of the weight at a specific gap.

2. The lift pin assembly of claim 1,
    wherein the pressing bracket is provided to be adjusted in height simultaneously when a level of the level bolt is adjusted.

3. The lift pin assembly of claim 1,
    wherein the pressing bracket includes:
    a pressing part having one end fixed to the level bolt and positioned while maintaining the specific gap from the top surface of the weight.

4. The lift pin assembly of claim 3,
    wherein the pressing bracket further includes:
        a vertical part vertically extending downward from one side of the pressing part; and
        a fixing part extending horizontally from a lower end of the vertical part and fixed by a lower tab of the level bolt.

5. The lift pin assembly of claim 4, wherein the lift pin assembly further includes:
    a bolt plate fixedly and horizontally coupled to a bottom surface of the first frame, and
    wherein the level bolt is mounted on the bolt plate, perpendicularly to the bolt plate.

6. The lift pin assembly of claim 5, wherein the level bolt includes:
    a bolt head positioned on a top surface of the bolt plate; and
    a lower tab positioned on a bottom surface of the bolt plate, and
    wherein the fixing part of the pressing bracket is fixed to the lower tab of the level bolt adjusted in height on the bolt plate.

7. The lift pin assembly of claim 3, wherein the pressing part includes:
    a through hole having a diameter smaller than a diameter of the weight and greater than a diameter of the lift pin, and
    wherein the through hole is provided to be open in one side.

8. The lift pin assembly of claim 1, wherein the pressing bracket includes:
    a pressing part positioned while maintaining the specific gap from the top surface of the weight; and
    a fixing part extending vertically from one end of the pressing part and fixed to a side surface of the first frame.

9. The lift pin assembly of claim 8, wherein the fixing part includes:
    a slit hole vertically extending such that a fixing bolt is fixed to the side surface of the first frame.

10. An apparatus for treating a substrate, the apparatus comprising:
    a housing having a treatment space for performing a process for the substrate;
    a substrate support plate provided in the treatment space and having a pin hole and a top surface on which the substrate is placed; and
    a lift pin assembly configured to load/unload the substrate onto/from the substrate support plate,
    wherein the lift pin assembly includes:
        a lifting device;
        a first frame moved up and down by the lifting device;
        a level bolt mounted on the first frame;
        a lift pin having a weight provided at a lower end, wherein the lift pin is supported by the level bolt, and moved up, when the first frame is moved up, and moved down by self-weight when the first frame is moved down, and wherein the weight is directly connected to the lower end of the lift pin; and
        a pressing bracket configured to forcibly move down the lift pin, when the first frame is moved down and when the lift pin is locked into the pin hole,
    wherein the pressing bracket is adjustable in height to be set, and
    wherein when the pressing bracket is adjusted in height, a portion of the pressing bracket is positioned over a top surface of the weight of the lift pin at a specific gap.

11. The apparatus of claim 10,
    wherein the pressing bracket include:
        a fixing part fixed to a lower end of the level bolt;
        a vertical part vertically extending upward from the fixing part; and
        a pressing part horizontally extending from the vertical part, positioned over the top surface of the weight, and provided to maintain the specific gap from the top surface of the weight, and
    wherein the pressing bracket is provided to be adjusted in height simultaneously when a level of the level bolt is adjusted.

12. The apparatus of claim 11,
    wherein the pressing part includes a through hole having a diameter smaller than a diameter of the weight and greater than a diameter of the lift pin, and wherein the through hole is provided to be open in one side.

13. The apparatus of claim 10, further comprising:
a bolt plate fixedly and horizontally coupled to a bottom surface of the first frame,
wherein the level bolt is mounted on the bolt plate, perpendicularly to the bolt plate.

14. The apparatus of claim 13,
wherein the level bolt includes:
  a bolt head positioned on a top surface of the bolt plate, and configured to support the weight of the lift pin, when the first frame is moved up; and
  a lower tab positioned on a bottom surface of the bolt plate, and wherein a fixing part of the pressing bracket is fixed to the lower tab.

15. The apparatus of claim 10,
wherein the pressing bracket includes:
  a pressing part positioned while maintaining the specific gap from the top surface of the weight; and
  a fixing part extending vertically from one end of the pressing part, and fixed to a side surface of the first frame.

16. The apparatus of claim 15,
wherein the fixing part includes a slit hole vertically extending such that a fixing bolt is fixed to the side surface of the first frame and a fixing height of the pressing bracket is adjusted.

17. The apparatus of claim 10,
wherein the lifting device includes:
  a base frame provided under the first frame;
  lifting units spaced apart from a center of the base frame by a specific distance, and provided on the base frame to be elevatable;
  a driving unit to drive such that the lifting units are simultaneously moved up and moved down; and
  a power transmitting unit to simultaneously transmit driving force of the driving unit to the lifting units.

18. A lift pin assembly configured to load/unload a substrate onto/from a substrate support plate, and comprising:
  a first frame moved up and down by a lifting device;
  a level bolt mounted on the first frame;
  a lift pin having a weight provided at a lower end, supported by the level bolt, and moved up when the first frame is moved up, and moved down by self-weight when the first frame is moved down; and
  a pressing bracket configured to forcibly move down the lift pin when the first frame is moved down and when the lift pin is locked into a pin hole that is formed in the substrate support plate,
wherein the pressing bracket includes:
  a fixing part fixed to a lower end of the level bolt;
  a vertical part vertically extending upward from the fixing part; and
  a pressing part horizontally extending from the vertical part and positioned over a top surface of the weight, and provided to maintain a specific gap from the top surface of the weight, and
wherein the pressing bracket is provided to be adjusted in height simultaneously, when a level of the level bolt is adjusted.

19. The lift pin assembly of claim 18, further comprising:
a bolt plate fixedly and horizontally fixed to a bottom surface of the first frame,
wherein the level bolt is perpendicularly mounted on the bolt plate,
wherein the level bolt includes:
  a bolt head positioned on a top surface of the bolt plate to support the weight of the lift pin, when the first frame is moved up; and
  a lower tab positioned on the bottom surface of the bolt plat, and
wherein the fixing part of the pressing bracket is fixed to the lower tab.

20. The lift pin assembly of claim 18,
wherein the pressing part includes a through hole having a diameter smaller than a diameter of the weight and greater than a diameter of the lift pin, and
wherein the through hole is provided to be open in one side.

* * * * *